United States Patent
Pan et al.

(10) Patent No.: US 11,475,293 B1
(45) Date of Patent: Oct. 18, 2022

(54) LEARNING-BASED TOGGLE ESTIMATION

(71) Applicant: Synopsys, Inc., Mountain View, CA (US)

(72) Inventors: Gung-Yu Pan, Hsinchu (TW); Chia-Chih Yen, Hsinchu (TW); Che-Hua Shih, Hsinchu (TW)

(73) Assignee: Synopsys, Inc., Mountain View, CA (US)

( * ) Notice: Subject to any disclaimer, the term of this patent is extended or adjusted under 35 U.S.C. 154(b) by 1016 days.

(21) Appl. No.: 16/183,567

(22) Filed: Nov. 7, 2018

Related U.S. Application Data (60) Provisional application No. 62/582,353, filed on Nov. 7, 2017.

(51) Int. Cl.
| | |
|---|---|
| *G06F 11/22* | (2006.01) |
| *G06F 30/3308* | (2020.01) |
| *G06N 3/08* | (2006.01) |
| *G06N 20/20* | (2019.01) |
| *G06N 3/04* | (2006.01) |

(52) U.S. Cl.
CPC .......... *G06N 3/08* (2013.01); *G06F 11/2263* (2013.01); *G06N 3/0454* (2013.01); *G06N 20/20* (2019.01); *G06F 30/3308* (2020.01)

(58) Field of Classification Search
USPC ......................................................... 716/106
See application file for complete search history.

(56) References Cited

U.S. PATENT DOCUMENTS 8,756,047 B2 * 6/2014 Patel ..................... H02J 3/06
706/16

2016/0098504 A1 4/2016 Larzul et al.
2018/0086222 A1 * 3/2018 Juang ................... G06N 3/0454

OTHER PUBLICATIONS

Cao, "Circuit Power Estimation Using Pattern Recognition Techniques," IEEE, Proceedings of the IEEE/ACM International Conference on Computer-Aided Design, pp. 412-417 (2002).
Govindaraj et al., "ANFIS and BPNN Based Power Estimation Method for CMOS VLSI Circuits," International Journal of Advanced Engineering Technology, VII(I):293-300, (2016).
Hou et al., Neural Network Based VLSI Power Estimation, IEEE, Proceedings of the IEEE International Conference on Solid State and Integrated Circuit Technology, 3 pages, (2006).
Ramanathan et al., "Power Estimation of Sequential Circuits Using Back Propagation Neural Networks," Emirates Journal for Engineering Research, 17(2):15-22, (2012).

* cited by examiner

*Primary Examiner* — Bryce M Aisaka
(74) *Attorney, Agent, or Firm* — Weaver Austin Villeneuve & Sampson LLP (57) ABSTRACT

A method of estimating a toggle count of a circuit, includes, in part, simulating the circuit to generate training data and an associated training toggle count of the internal nodes of the circuit in response to a test bench, training a neural network system to generate an estimate of the training toggle count in accordance with the training data and the associated training toggle count, simulating the circuit to generate simulation data in response to a first set of input values applied to the circuit, and invoking the trained neural network system to estimate a number of toggles of the internal nodes of the circuit from the simulation data. The training data may include, in part, values of input signals applied to the circuit and values of registers disposed in the circuit for a multitude of time stamps. The neural network system may include, in part, at least three layers.

12 Claims, 7 Drawing Sheets

| TIMESTAMP | INPUT SIGNALS | REGISTER VALUES | TOGGLE |
|---|---|---|---|
| | | | |
| | | | |
| | | | |

LEARNING-BASED TOGGLE ESTIMATION

CROSS-REFERENCE TO RELATED APPLICATION

The present application claims benefit under 35 USC 119(e) of Application Ser. No. 62/582,353, filed Nov. 7, 2017, the content of which is incorporated herein by reference in its entirety.

COPYRIGHT NOTICE

The assignee of this patent document has no objection to the facsimile reproduction by anyone of the patent document itself or of the patent application, as it appears in the files of the United States Patent and Trademark Office, but otherwise reserves all rights whatsoever in any included works of authorship protected by copyright.

SPECIFICATION—DISCLAIMER

In the following Background, Summary, and Detailed Description, headings should not be construed as necessarily limiting. In the following Background, Summary and Detailed Description, the citation or identification of any publication does not signify relevance or status as prior art for any of the claimed or described embodiments. Paragraphs for which the text is all italicized signifies text that is common to multiple Synopsys patent specifications.

BACKGROUND

Signal toggles play an important role in power consumption of an integrated circuit. However, full simulation to dump the waveform to determine the toggle count is time-consuming. Several heuristic and regression methods are known to provide relatively fast estimation of the toggle count, but it is difficult to approximate the number of toggles accurately due to severe non-linearity in logic functions.

SUMMARY

The claims signify a brief description of one or more of the innovations, embodiments, and/or examples found within this disclosure.

A method of estimating a toggle count of a circuit, in accordance with one embodiment of the present invention includes, in part, simulating the circuit to generate training data and an associated training toggle count of internal nodes of the circuit in response to a test bench, training a neural network system to generate an estimate of the training toggle count in accordance with the training data and the associated training toggle count, simulating the circuit to generate simulation data in response to a first set of input values applied to the circuit, and invoking the trained neural network system to estimate a number of toggles of the internal nodes of the circuit from the simulation data.

In one embodiment, the training data includes, in part, values of input signals applied to the circuit and values of registers disposed in the circuit for a multitude of time stamps. In one embodiment, the neural network system includes, in part, at least three layers. In one embodiment, the first layer of the neural network system includes, in part, first and second neural networks, wherein the first neural network is configured to receive input signals and register values associated with a timestamp immediately preceding a current timestamp, and wherein the second neural network is configured to receive input signals and register values associated with the current timestamp, wherein the first and second neural networks of the first layer have the same number of input/output nodes and a same weight between their corresponding nodes.

In one embodiment, the second layer of the neural network system is configured to determine a pairwise distance between corresponding output nodes of the first and second neural networks of the first layer and to supply an output value in response. In one embodiment, the third layer of the neural network system is configured to normalize the output value of the second layer of the neural network system.

A neural network system, in accordance with one embodiment of the present invention, includes at least a first layer, which in turn, includes first and second neural networks, wherein the first neural network is configured to receive input signals and register values associated with a simulation timestamp immediately preceding a current timestamp cycle of a circuit design, and wherein the second neural network is configured to receive input signals and register values associated with the current simulation timestamp of circuit design, wherein said first and second neural networks of the first layer have a same number of input/output nodes and a same weight between their corresponding nodes.

In one embodiment, the neural network system further comprises a second layer configured to determine a pairwise distance between corresponding output nodes of the first and second neural networks of the first layer and supply an output value in response.

In one embodiment, the neural network system further comprises a third layer configured to normalize the output value of the second layer and which is representative of a number of toggles of the simulation.

This Summary does not attempt to completely signify any particular innovation, embodiment, or example as it can be used in commerce. Additionally, this Summary is not intended to signify essential elements of an innovation, embodiment or example or to limit the scope of the subject matter of this disclosure.

The innovations, embodiments, and/or examples found within this disclosure are not all-inclusive, but rather describe the basic significance of the subject matter. Accordingly, one use of this Summary is as a prelude to a Detailed Description presented later.

DRAWINGS

The following Detailed Description, Figures, appended Additional Figures and appended Claims signify the nature and advantages of the innovations, embodiments and/or examples of the claimed inventions. All of the Figures signify innovations, embodiments, and/or examples of the claimed inventions for purposes of illustration only and do not limit the scope of the claimed inventions. Such Figures are not necessarily drawn to scale, and are part of the Disclosure.

In the Figures, similar components or features may have the same, or similar, reference signs in the form of labels (such as alphanumeric symbols, e.g., reference numerals), and may signify similar or equivalent functionality. Further, various components of the same type may be distinguished by following the reference label by a dash and a second label that distinguishes among the similar components. If only the first reference label is used in the specification, the description is applicable to any one of the similar components having the same first reference label irrespective of the second reference label. A brief description of the Figures is below.

In such various figures, reference signs may be omitted as is consistent with accepted engineering practice; however, one of ordinary skill in the art will understand that the illustrated components are readily understood when viewed in context of the illustration as a whole and the accompanying disclosure describing such various figures.

DETAILED DESCRIPTION

The Figures and the following Detailed Description signify innovations, embodiments and/or examples by way of illustration only, with various features, structures or characteristics described together in a single embodiment to streamline the disclosure. Variations of any of the elements, processes, machines, systems, manufactures or compositions disclosed by such exemplary innovations, embodiments and/or examples will be readily recognized and may be used in commerce without departing from the principles of what is claimed. The Figures and Detailed Description may also signify, implicitly or explicitly, advantages and improvements of a subset of the exemplary embodiments described herein.

In the Figures and Detailed Description, numerous specific details may be described to enable one or more of the exemplary innovations, embodiments and/or examples. In the interest of not obscuring the presentation of the exemplary innovations, embodiments and/or examples in the following Detailed Description, some processing steps or operations that are known in the art may be combined together for presentation and for illustration purposes and might not be described in detail. However, a person skilled in the art will recognize that these exemplary innovations, embodiments and/or examples may be used in commerce without these specific details or with equivalents thereof. In other instances, well-known processes and devices are not described in detail as not to unnecessarily obscure aspects of these exemplary innovations, embodiments and/or examples. In other instances, some processing steps or operations that are known in the art may not be described at all. Instead, the following description is focused on the distinctive features or elements of various exemplary innovations, embodiments and/or examples. Furthermore, while this description may refer to some components of the structure in the singular tense, more than one component may be depicted throughout the Figures and like components are labeled with like numerals.

In accordance with embodiments of the present invention, the number of toggles occurring within an entire or a block/module of an integrated circuit is estimated by a supervised learning framework using the waveform of primary input signals applied to the block and registers disposed in the block. To achieve this, the toggle estimation is transformed into a similarity learning problem, and subsequently applied to a neural network system to approximate the nonlinear relationship between the input/output signals and the number of toggles. The model is trained to learn from a set of training data.

A neural network system, in accordance with embodiment of the present invention, provides a more accurate estimation of the toggle count than conventional system and requires less training and evaluation time. The learning system can calculate dynamic power by weighted summation of the toggle counts. Using the embodiments of the present invention, logic simulators can quickly estimate simulation time by predicting the number of events, and waveform-related tools can quickly estimate the number of value changes.

A neural system, in accordance with embodiment of the present invention, approximates the nonlinear relationship between input features, such as waveforms of specific signals, and an output target, such as the toggle count of a design block.

Figure 1:
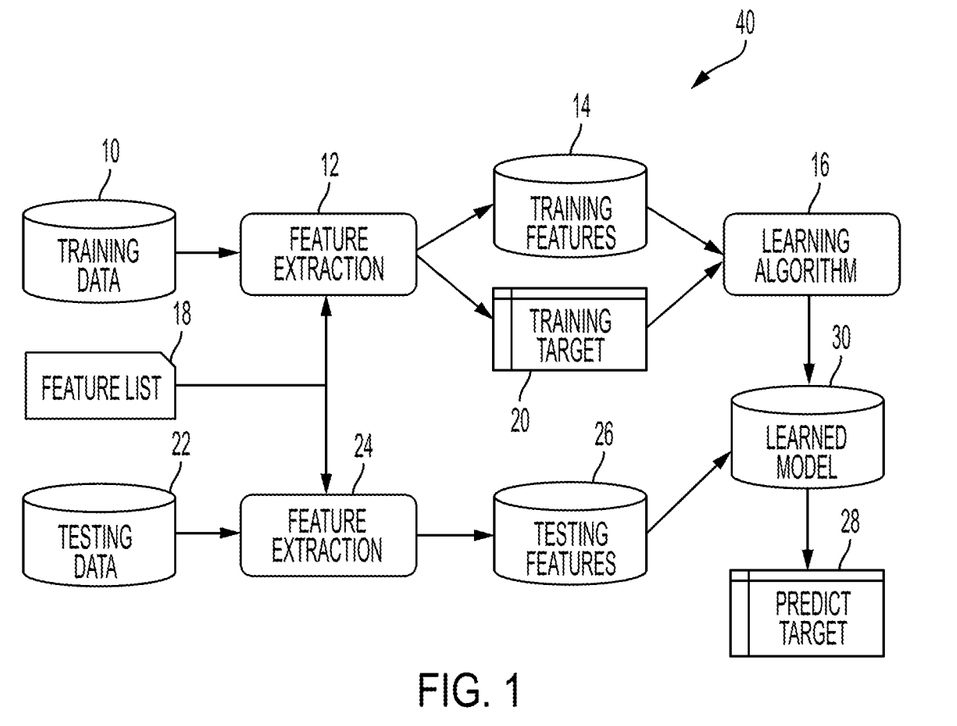
FIG. 1 is a flow diagram of steps performed to estimate the number of signal toggles using a neural network system, in accordance with one embodiment of the present invention.

FIG. 1 is a flow diagram 40 of steps performed to estimate the number of signal toggles using a neural network system, in accordance with one embodiment of the present invention. Training data 10 that is in the form of circuit simulation results or waveforms is used to for feature extraction at 12. In one embodiment, the features extracted from the simulation results and in accordance with the list of features supplied by feature list 18 include, in part, the input signal values applied to the block (referred to herein alternatively as primary input signals), and the output values of the registers disposed in the block during each time stamp. In other words, feature list 18 provides the list of features, such as primary inputs and register values, subsequently extracted from the training data 10 to arrive at feature extraction step 12.

The number of toggles associated with each time stamp is also extracted during feature extraction 12. The primary input signal values together with the register values collectively form the training features 14, as shown in FIG. 1. The number of toggles associated with and occurring during different time stamps form the training target 20, also shown in FIG. 1. At 16, a neural network system, as described further below with reference to FIG. 5, performs a learning algorithm 16 so as to cause a match (within a margin) between the number of toggles known in advance from the training data (i.e., the golden number) and the number of toggles in the training target 20. The matching process involves adjusting weights between various nodes of the neural network system. The algorithm learned at 16 results in the generation of the learned model 30 corresponding to the neural network and its associated optimized weights.

To test the learned model 30, waveforms corresponding to other simulation results of the block are supplied as testing data 22. Using feature list 18, during feature extraction 24, the primary input signals, and register values are extracted from testing data 22. Next, at testing features 26, the primary input signals and register values from multiple testing data 22 are aggregated and supplied to learned model 30. At predict target step 28, the learned model 30 provides an accurate estimate of the number of toggles associated testing data 22.

Figure 2:
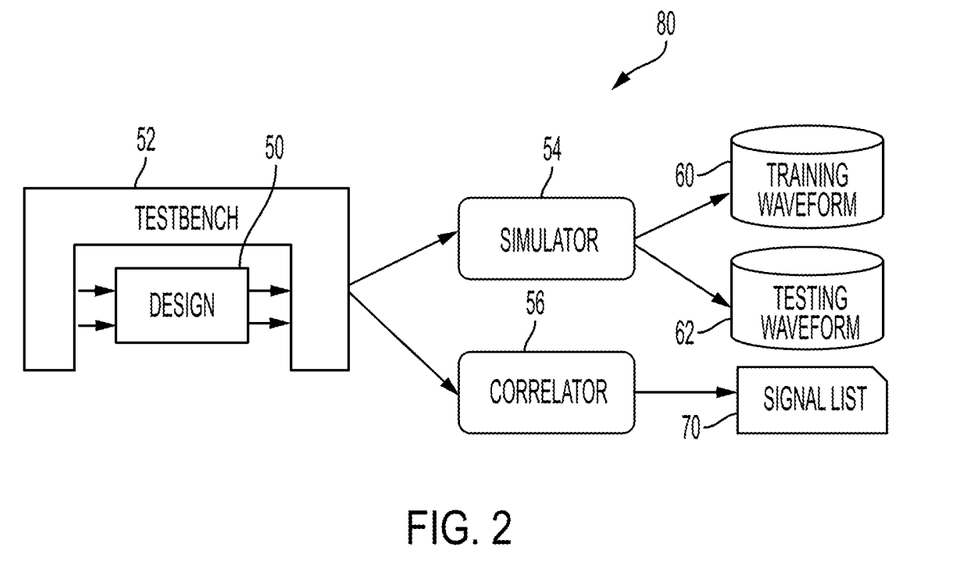
FIG. 2 shows a dataflow associated with generating the data used to train a neural network system to predict the number of toggles of a circuit, in accordance with one embodiment of the present invention.

FIG. 2 shows a dataflow associated with generating the data used to train and predict the number of toggles, in accordance with one embodiment of the present invention. As shown, test bench 52 is applied to design block 50 by logic/circuit simulator 54 to generate training waveform 60, corresponding to training data 10 of FIG. 1, and further to generate testing waveform 62 corresponding to testing data 22 shown in FIG. 1. Correlator 56 uses the test bench 52 applied to design 50 to generate the signal list 70 that corresponds to feature list 18, which as described above are the input signals to the block and the output signals of the registers disposed in the block.

In one embodiment, clock signals are excluded from signal list 70 because all the registers are already included in the signal list. In one embodiment, signals associated with a memory are excluded from the signal list.

Figure 3:
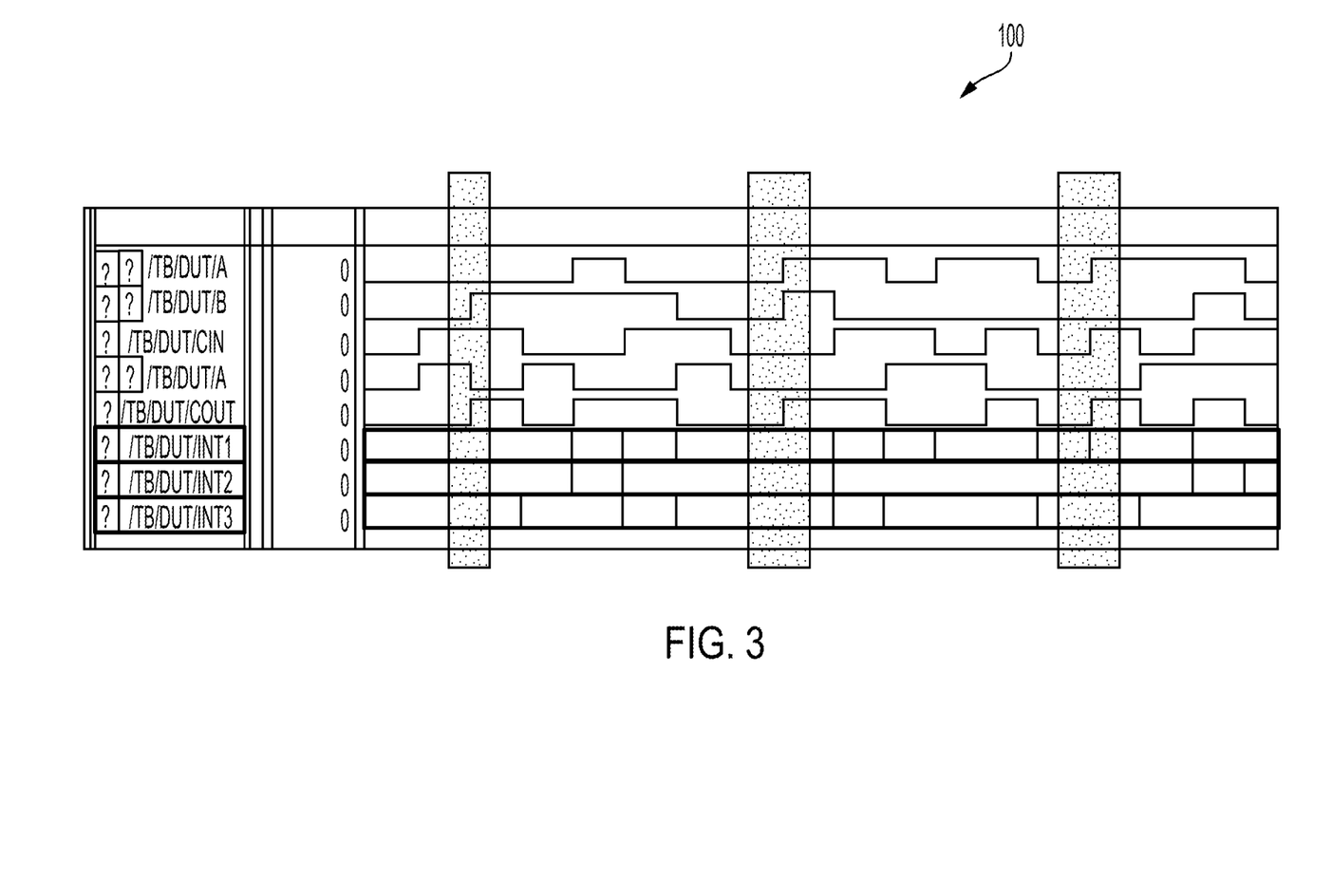
FIG. 3 is an exemplary simulation results used to train a neural network system, in accordance with one embodiment of the present invention.

To extract features during training and testing, the block under design/test is simulated using a test bench as shown in FIG. 2. The simulations result in the generation of waveforms 100 for both training and testing, as shown in FIG. 3.

Figure 4:
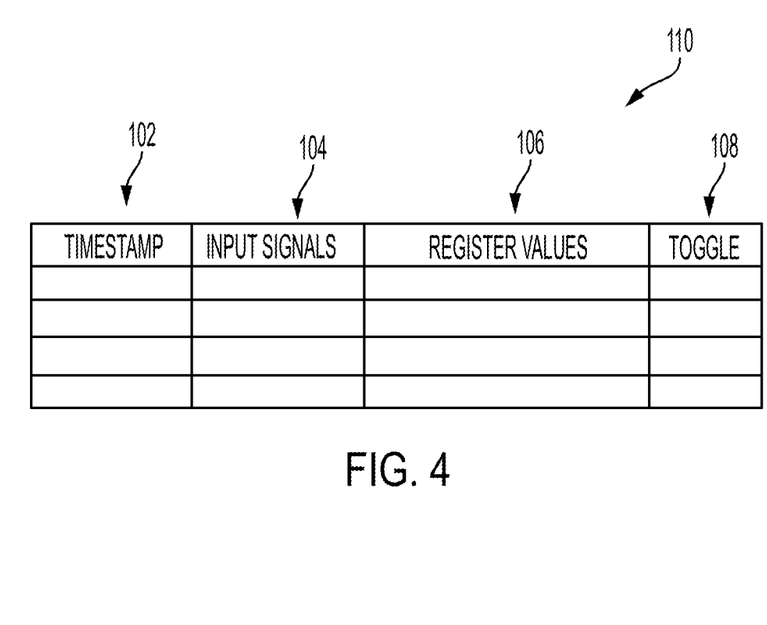
FIG. 4 is a table in which values extracted from the simulation results are stored, in accordance with one embodiment of the present invention.

From the simulation results, a table 110, as shown in FIG. 4 is generated. In column 102 of the table, the time stamp associated with the signal values are recorded. In one embodiment, the timestamp unit is the same as the waveform time unit.

Column 104 includes values of all input signals to the block during the recorded time stamp. Likewise, column 106 includes values of all register values disposed in the block during the recorded time stamps.

The toggle count of all the internal nodes is recorded in the last column, namely column 108 of the table. The toggle count at any current time stamp represents the sum of the value changes associated with the internal nodes of the block between the previous timestamp and the current timestamp. It is understood that every value change (VC) is a function of two consecutive timestamps of input signals recorded in column 104 and register values recorded in column 106. Since the toggle count 108 for each timestamp is the sum of all the VCs, the toggle count is therefore a function of the primary input signals and register values.

To account for the propagation delay between the internal nodes, in one embodiment, the timestamp is not stepped until a value change occurs for any of the input signals and/or register values. In other words, at least one input signals and/or register values changes its value between two adjacent rows in table 110.

In the simulation results waveform of FIG. 3, all signal transitions are shown as occurring without any delay. In other words, the primary input signals, register outputs and internal nodes are seen as changing their values without any delay. However, as is well known, it takes time for a change in an input signal or a register value to propagate to other nodes in a circuit. For example, there is a delay between the time when a clock signal applied to a register is asserted and the time when the output of the register changes. Primary input values may not be synchronous with the clock and may change between two clock edges. Similarly, due to propagation delays, it takes time for internal nodes to respond to changes in signal changes elsewhere in a design.

To account for such delays in counting the number of toggles, in accordance with one embodiment, a default window length is selected for determining a toggle. The default window length may be selected to be, for example, half the cycle for clock-to-Q delay of a register. In yet other embodiment, the default window length may be selected to be, for example, one quarter of the cycle for clock-to-Q delay of a register. In some embodiments, the clock skew may be considered in selecting the window length.

Figure 5:
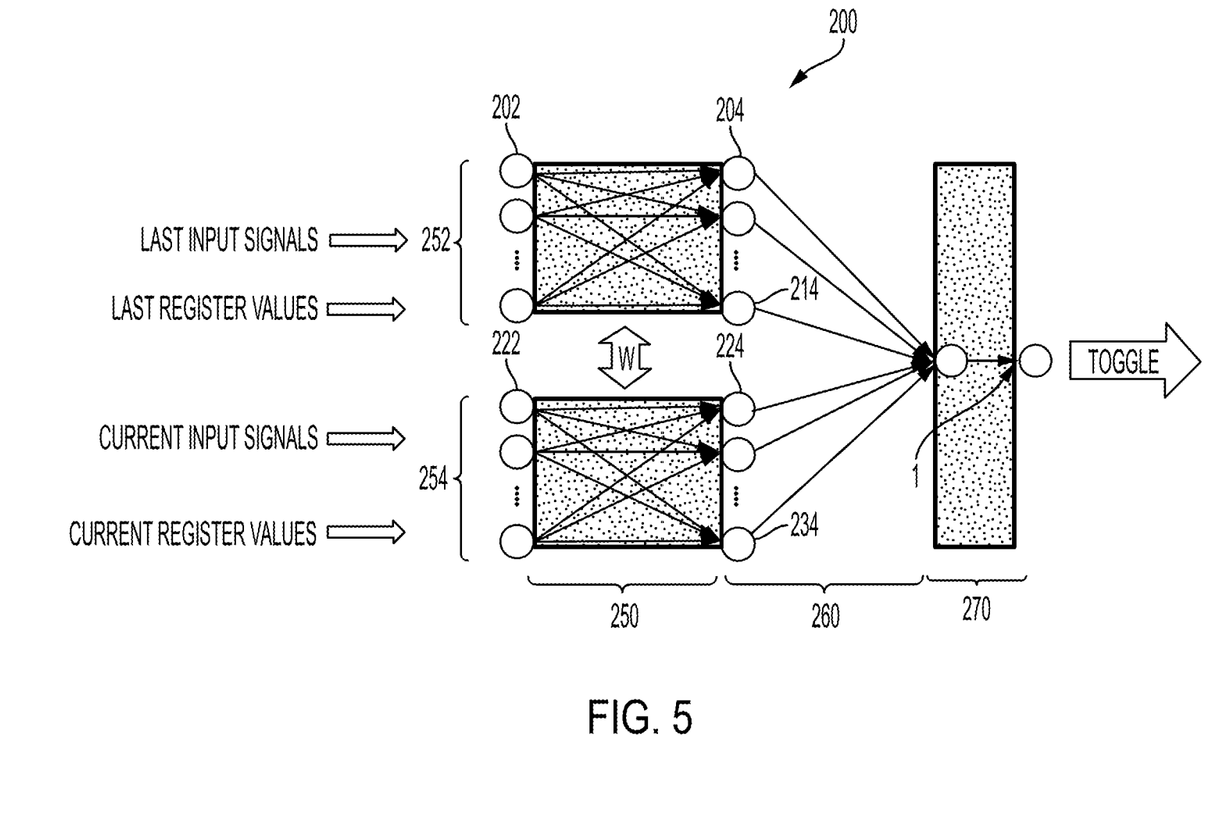
FIG. 5 is a block diagram of a neural network system configured to estimate the toggle count associated with a design block, in accordance with one embodiment of the present invention.

FIG. 5 is a block diagram of a neural network 200 configured to be trained and estimate the toggle count associated with a design block, in accordance with one embodiment of the present invention. Neural network 200 is shown as including three layers, namely layers 250, 260 and 270.

Layer 250 is shown as including two fully-connected neural networks (FCNN) 252 and 254 which have the same weight values between their corresponding nodes, For example, the weight between nodes 202 and 204 of FCNN 252 is the same as the weight between nodes 222 and 224 of FCNN 254. Likewise, the weight between nodes 202 and 214 of FCNN 252 is the same as the weight between nodes 222 and 234 of FCNN 254. FCNN 252 receives the input signals and the register values associated with the last timestamp (e.g. timestamp T−1), and FCNN 254 receives the input signals and the register values associated with the current timestamp (e.g. timestamp T). In one embodiment, the activation function used in layer 250 is a parametric rectified linear unit (PReLU).

The second layer 260 evaluates the pairwise L2 distance between the outputs of last and current input signals and register values. For example, layer 260 evaluates the pairwise distance associated with nodes 204 and 224, and the pairwise distance associated with nodes 214 and 234. Layers 250 and 260 form a Siamese architecture where the learned weights account for the characteristics of the design block, and each set of outputs is the encoding of the signals associated with input signals to the design block and the register values disposed in the design block. The distance between the encoded input and register signals is used to estimate the toggles.

The third layer 370, is a multiplication layer for output normalization. Depending on the depths of two different blocks, the scale of toggle counts could be different if the two blocks have the same number of input signals and register counts. It is seen that when the values of input signals and register values are the same, the encoded values from layers 250 and 260 are the same, thus causing the output of neural network 200 to be zero.

DETAILED DESCRIPTION—TECHNOLOGY SUPPORT

GENERAL COMPUTER EXPLANATION

Figure 6A:
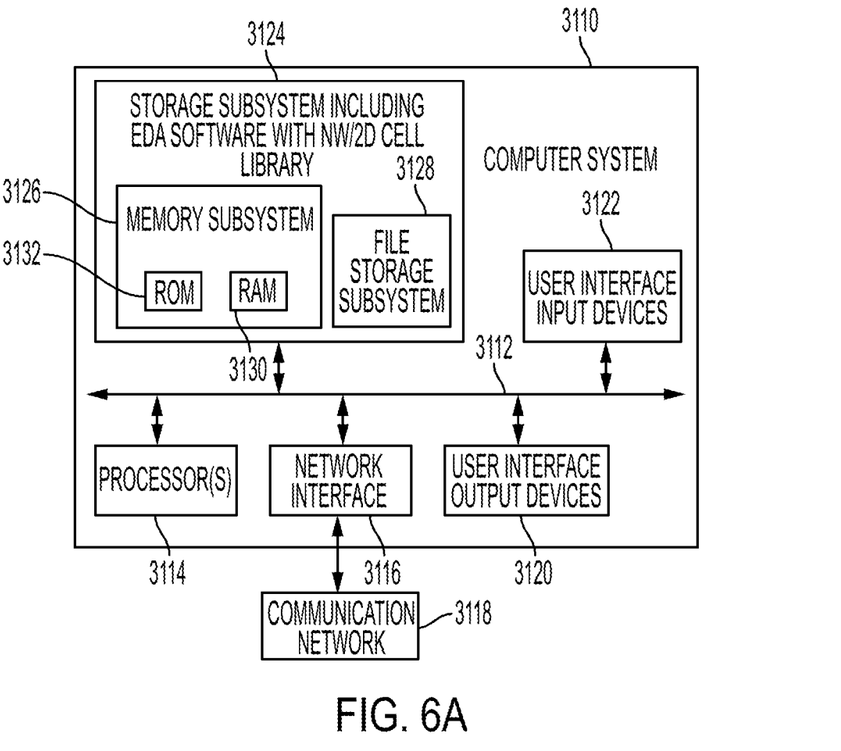
FIGS. 6A, 6B and 6C depict simplified block diagrams of a computer system suitable for use with embodiments of the technology, as well as circuit design and circuit embodiments of the technology.
Figure 6B:
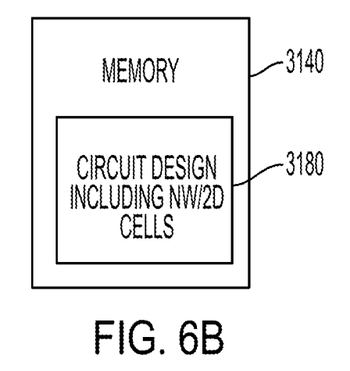
Figure 6C:
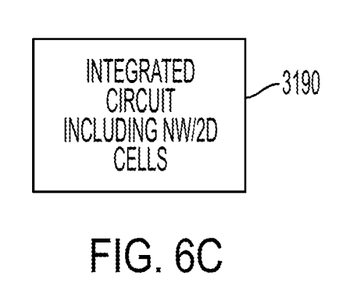

FIGS. 6A, 6B and 6C are simplified block diagrams of a computer system suitable for use with embodiments of the technology, as well as circuit design and circuit embodiments of the technology.

In FIG. 6A, computer system 3110 typically includes at least one computer or processor 3114 which communicates with a number of peripheral devices via bus subsystem 3112. Typically, the computer can include, or the processor can be, any of a microprocessor, graphics processing unit, or digital signal processor, and their electronic processing equivalents, such as an Application Specific Integrated Circuit (ASIC) or Field Programmable Gate Array (FPGA). The terms 'processor' and 'computer' are further defined below. These peripheral devices may include a storage subsystem 3124, comprising a memory subsystem 3126 and a file storage subsystem 3128, user interface input devices 3122, user interface output devices 3120, and a network interface subsystem 3116. The input and output devices allow user interaction with computer system 3110.

The computer system may be a server computer, a client computer, a workstation, a mainframe, a personal computer (PC), a tablet PC, a set-top box (STB), a personal digital assistant (PDA), a cellular telephone, a smartphone, a web appliance, a rack-mounted "blade", a kiosk, a television, a game station, a network router, switch or bridge, or any data processing machine capable of executing instructions 124 (sequential or otherwise) that specify actions to be taken by that machine.

The computer system typically includes an operating system, such as Microsoft's Windows, Sun Microsystems's Solaris, Apple Computer's MacOs, Linux or Unix. The computer system also typically can include a Basic Input/Output System (BIOS) and processor firmware. The operating system, BIOS and firmware are used by the processor to control subsystems and interfaces connected to the processor. Typical processors compatible with these operating systems include the Pentium and Itanium from Intel, the Opteron and Athlon from Advanced Micro Devices, and the ARM processor from ARM Holdings.

Innovations, embodiments and/or examples of the claimed inventions are neither limited to conventional computer applications nor the programmable apparatus that run them. For example, the innovations, embodiments and/or examples of what is claimed can include an optical computer, quantum computer, analog computer, or the like. The computer system may be a multi-processor or multi-core system and may use or be implemented in a distributed or remote system. The term 'processor' here is used in the broadest sense to include a singular processor and multi-core or multi-processor arrays, including graphic processing units, digital signal processors, digital processors and combinations of these devices. Further, while only a single computer system or a single machine may be illustrated, the use of a singular form of such terms shall also signify any collection of computer systems or machines that individually or jointly execute instructions 124 to perform any one or more of the sets of instructions discussed herein. Due to the ever-changing nature of computers and networks, the description of computer system 3110 depicted in FIG. 6A is intended only as one example for purposes of illustrating the preferred embodiments. Many other configurations of computer system 3110 are possible having more or less components than the computer system depicted in FIG. 6A.

Network interface subsystem 3116 provides an interface to outside networks, including an interface to communication network 3118, and is coupled via communication network 3118 to corresponding interface devices in other computer systems or machines. Communication network 3118 may comprise many interconnected computer systems, machines and communication links. These communication links may be wireline links, optical links, wireless links, or any other devices for communication of information. Communication network 3118 can be any suitable computer network, for example a wide area network such as the Internet, and/or a local area network such as Ethernet. The communication network can be wired and/or wireless, and the communication network can use encryption and decryption methods, such as is available with a virtual private network. The communication network uses one or more communications interfaces, which can receive data from, and transmit data to, other systems. Embodiments of communications interfaces typically include an Ethernet card, a modem (e.g., telephone, satellite, cable, or ISDN), (asynchronous) digital subscriber line (DSL) unit, Firewire interface, USB interface, and the like. One or more communications protocols can be used, such as HTTP, TCP/IP, RTP/RTSP, IPX and/or UDP.

User interface input devices 3122 may include an alphanumeric keyboard, a keypad, pointing devices such as a mouse, trackball, touchpad, stylus, or graphics tablet, a scanner, a touchscreen incorporated into the display, audio input devices such as voice recognition systems or microphones, eye-gaze recognition, brainwave pattern recognition, and other types of input devices. Such devices can be connected by wire or wirelessly to a computer system. In general, use of the term "input device" is intended to include all possible types of devices and ways to input information into computer system 3110 or onto communication network 3118. User interface input devices typically allow a user to select objects, icons, text and the like that appear on some types of user interface output devices, for example, a display subsystem.

User interface output devices 3120 may include a display subsystem, a printer, a fax machine, or non-visual displays such as audio output devices. The display subsystem may include a cathode ray tube (CRT), a flat-panel device such as a liquid crystal display (LCD), a projection device, or some other device for creating a visible image such as a virtual reality system. The display subsystem may also provide non-visual display such as via audio output or tactile output (e.g., vibrations) devices. In general, use of the term "output device" is intended to include all possible types of devices and ways to output information from computer system 3110 to the user or to another machine or computer system.

Memory subsystem 3126 typically includes a number of memories including a main random-access memory (RAM) 3130 (or other volatile storage device) for storage of instructions and data during program execution and a read only memory (ROM) 3132 in which fixed instructions are stored. File storage subsystem 3128 provides persistent storage for program and data files, and may include a hard disk drive, a floppy disk drive along with associated removable media, a CD-ROM drive, an optical drive, a flash memory, or removable media cartridges. The databases and modules implementing the functionality of certain embodiments may be stored by file storage subsystem 3128.

Bus subsystem 3112 provides a device for letting the various components and subsystems of computer system 3110 communicate with each other as intended. Although bus subsystem 3112 is shown schematically as a single bus, alternative embodiments of the bus subsystem may use multiple busses. For example, RAM-based main memory can communicate directly with file storage systems using Direct Memory Access (DMA) systems.

FIG. 6B depicts a memory 3140 such as a non-transitory, computer readable data and information storage medium associated with file storage subsystem 3128, and/or with network interface subsystem 3116, and can include a data structure specifying a circuit design. The memory 3140 can be a hard disk, a floppy disk, a CD-ROM, an optical medium, removable media cartridge, or other medium that stores computer readable data in a volatile or non-volatile form. Software read into a computer from such a memory can be converted at a selected instance in time from a tangible form to a transmission signal that is propagated through a medium (such as a network, connector, wire, or trace as an electrical pulse or a medium such as space or an atmosphere as electromagnetic radiation with wavelengths in the electromagnetic spectrum longer than infrared light).

FIG. 6C signifies an integrated circuit 3190 created with the described technology that includes one or more cells selected, for example, from a cell library.

DETAILED DESCRIPTION—TECHNOLOGY SUPPORT

HARDWARE/SOFTWARE EQUIVALENCE

Some of the innovations, embodiments and/or examples described herein comprise and/or use a processor. As used herein, the term 'processor' signifies a tangible data and information processing device that physically transforms data and information, typically using a sequence transformations (also referred to as 'operations'). Data and information can be physically represented by an electrical, magnetic, optical or acoustical signal that is capable of being stored, accessed, transferred, combined, compared, or otherwise manipulated by the processor. The term "processor" can signify a singular processor and multi-core systems or multi-processor arrays, including graphic processing units, digital signal processors, digital processors or combinations of these elements.

The processor can be electronic, for example, comprising digital logic circuitry (for example, binary logic), or analog (for example, an operational amplifier). The processor can also be non-electronic, for example, as seen in processors based on optical signal processing, DNA transformations or quantum mechanics, or a combination of technologies, such as an optoelectronic processor. For data and information structured in binary form, any processor that can transform the data and information using the AND, OR and NOT logical operations (and their derivatives, such as the NAND, NOR, and XOR operations) can transform the data and information using any function of Boolean logic. A processor such as an analog neural network processor can also transform data and information non-digitally. There is no scientific evidence that any of these processors are processing, storing and retrieving data and information, in any manner or form equivalent to the bioelectric structure of the human brain.

The one or more processors may also operate to support performance of the relevant operations in a 'cloud computing' environment or as a 'software as a service' (SaaS). For example, at least some of the operations may be performed by a group of processors available at a distributed or remote system, these processors accessible via a communications network (e.g., the Internet) and via one or more software interfaces (e.g., an application program interface (API).)

As used herein, the term 'module' signifies a tangible data and information processing device, that typically is limited in size and/or complexity. For example, the term 'module' can signify one or more methods or procedures that can transform data and information. The term 'module' can also signify a combination of one or more methods and procedures in a computer program. The term 'module' can also signify a small network of digital logic devices, in which interconnections of the logic devices give structure to the network. Methods and procedures comprising a module, specified in a specialized language, such as System C, can be used to generate a specification for a network of digital logic devices that process data and information with exactly the same results as are obtained from the methods and procedures.

A module can be permanently configured (e.g., hardwired to form hardware), temporarily configured (e.g., programmed with software), or a combination of the two configurations (for example, a structured ASIC). Permanently configured modules can be manufactured, for example, using Application Specific Integrated Circuits (ASICs) such as Arithmetic Logic Units (ALUs), Programmable Logic Arrays (PLAs), or Read Only Memories (ROMs), all of which are typically configured during manufacturing. Temporarily configured modules can be manufactured, for example, using Field Programmable Gate Arrays (FPGAs—for example, sold by Xilink or Intel's Altera), Random Access Memories (RAMs) or microprocessors. A module is configured to process data and information, typically using a sequence transformations (also referred to as 'operations') applied to the data and information (or in the case of ROMs and RAMS, transforming data and information by using the input information as an address for memory that stores output data and information), to perform aspects of the present innovations, embodiments and/or examples of the invention.

Modules that are temporarily configured need not be configured at any one instance in time. For example, a processor comprising one or more modules can have the modules configured at different times. The processor can comprise a set of one or more modules at one instance of time, and to comprise a different set of one or modules at a different instance of time. The decision to manufacture or implement a module in a permanently configured form, a temporarily configured form, or a combination of the two forms, may be driven by cost, time considerations, engineering constraints and/or specific design goals. The "substance" of a module's processing is independent of the form in which it is manufactured or implemented.

As used herein, the term 'algorithm' signifies a process comprising a sequence or set of operations or instructions that a module can use to transform data and information to achieve a result. A module can comprise one or more algorithms. As used herein, the term 'thread' refers to a sequence of instructions that can comprise a subset of the instructions of an entire process or algorithm. A process or algorithm can be partitioned into multiple threads that can be executed in parallel.

As used herein, the term 'computer' includes at least one information processor that, for example, can perform certain operations such as (but not limited to) the AND, OR and NOT logical operations using electronic gates that can comprise transistors, with the addition of memory (for example, memory based on flip-flops using the NOT-AND or NOT-OR operation). Such a processor is said to be Turing-complete or computationally universal. A computer, whether or not it is a digital computer, typically comprises many modules.

As used herein, the term 'software' or 'program' signifies one or more algorithms and data structures that configure a processor for use in the innovations, embodiments and examples described in this specification. Such devices configurable by software include one or more computers, for example, standalone, client or server computers, or one or more hardware modules, or systems of one or more such computers or modules. As used herein, the term "software application" signifies a set of data and instructions that configure the processor to achieve a specific result, for example, to perform word processing operations, or to encrypt a set of data.

As used herein, the term 'programming language' signifies a grammar and syntax for specifying sets of instruction and data that comprise software. Programming languages include assembler instructions, instruction-set-architecture (ISA) instructions, machine instructions, machine dependent instructions, microcode, firmware instructions, state-setting data, or either source code or object code written in any combination of one or more higher level languages, such as conventional procedural programming languages, for example, the "C" programming language or similar programming languages (such as SystemC), or object oriented programming language such as Smalltalk, C++ or the like, and any future equivalent programming languages.

Software is entered into, equivalently, read into, one or memories of the computer or computer system from a data and information storage device. The computer typically has a device for reading storage media that is used to transport the software or has an interface device that receives the software over a network. This process is discussed in the General Computer Explanation section.

DETAILED DESCRIPTION—TECHNOLOGY SUPPORT

EDA SYSTEM/WORKFLOW EXPLANATION

Figure 7:
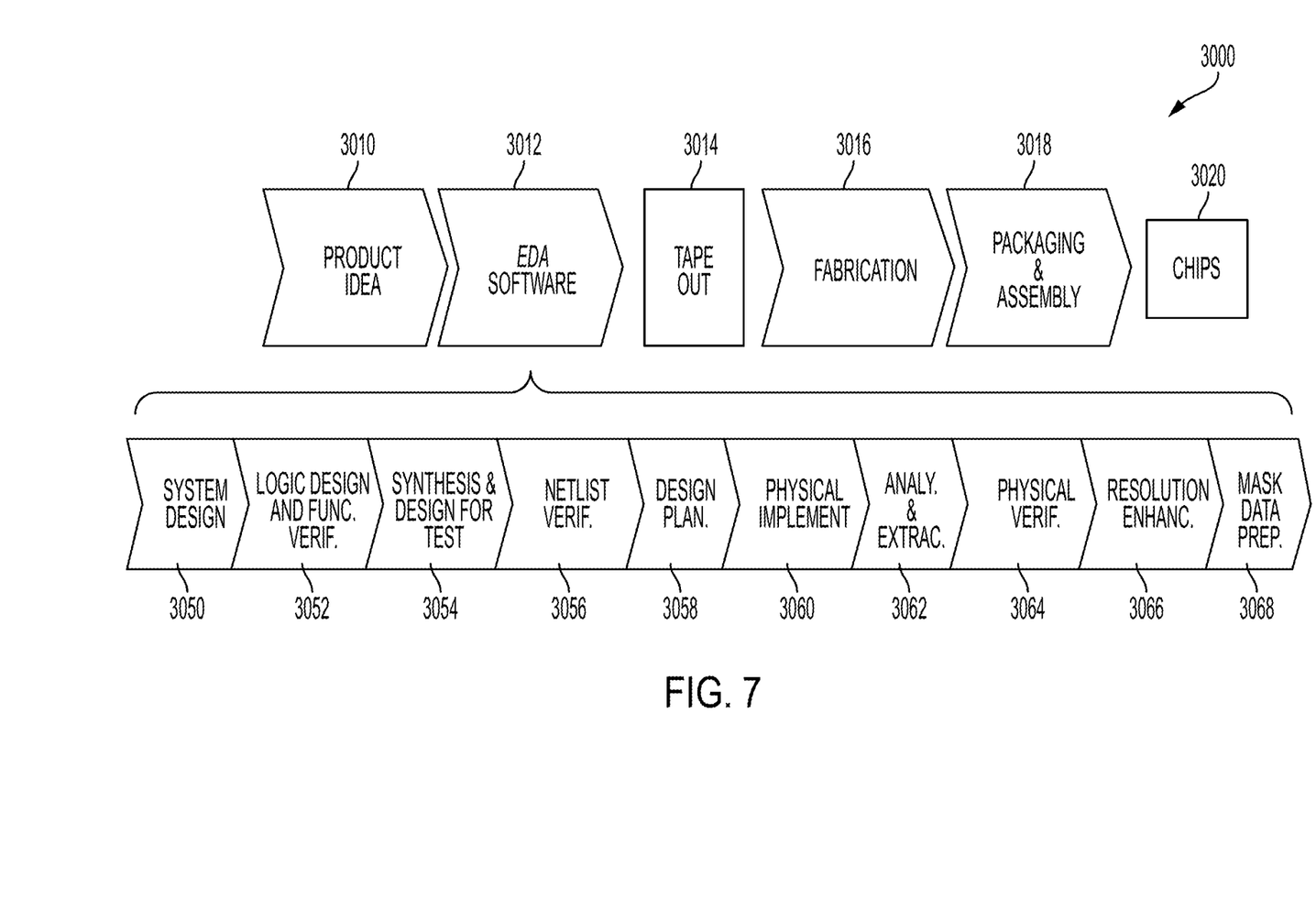
FIG. 7 illustrates various processes performed in the design, verification and fabrication of an integrated circuit design.

FIG. 7 illustrates various processes performed in the design, verification and fabrication of an item of manufacture such as an integrated circuit using software tools with a computer, and possibly special hardware-assisted tools, to transform and verify design data and instructions that represent the integrated circuit. These processes start with the generation of a product idea 3010 with information supplied by a designer, information which is transformed during a process to create an item of manufacture (referred to herein as a design or device) that uses an EDA software tool 3012, which may also be signified herein as EDA software, as a design tool, or a verification tool. When the design is finalized, it can be taped-out 3014, which typically is when artwork (e.g., geometric patterns) for the integrated circuit is sent to a fabrication facility to manufacture the mask set, which is then used to manufacture the integrated circuit. After tape-out, a semiconductor die is fabricated 3036 and packaging and assembly processes 3018 are performed, which result in the finished integrated circuit 3020 which may also be signified herein as a circuit, device, component, chip or SoC (System on Chip).

Items of manufacture, for example, a circuit or system are used in commerce at a variety of levels of abstraction ranging from low-level transistor layouts to high-level description languages. Most designers start at high-level of abstraction to design their circuits and systems, using a hardware description language (HDL) such as VHDL, Verilog, SystemVerilog, SystemC, MyHDL or OpenVera. The high-level HDL is easier for developers to comprehend, especially for a vast system, and may describe highly complex concepts that are difficult to grasp using a lower level of abstraction. The HDL description may be converted into other levels of abstraction as is helpful to the developers. For example, a high-level description may be converted to a logic-level register transfer level (RTL) description, a gate-level (GL) description, a layout-level description, or a mask-level description. Each lower abstraction level introduces more detail into the design description. The lower-levels of abstraction may be generated automatically by computer, derived from a design library, or created by another design automation technique. An example of a specification language at a lower level of abstraction is SPICE, much used detailed descriptions of analog-based circuits.

A design process that uses an EDA software tool 3012 includes processes 3050-3068, which are described below. This design flow description is for illustration purposes only and is not meant to limit the present disclosure. For example, an actual integrated circuit design may require a designer to perform the design operations in a different sequence than the sequence described herein.

During system design 3050, a designer describes the functionality to be manufactured. The designer can also perform what-if planning to refine the functionality and to check costs, etc. Hardware-software architecture partitioning can occur at this stage. Exemplary EDA software products from Synopsys, Inc. of Mountain View, Calif., that can be used at this stage include: Model Architect, Saber, System Studio, and Designware products.

During logic design and functional verification 3052, modules in the circuit are specified in one or more hardware description languages, or HDLs, and the design in HDL is checked for functional accuracy, that is, to match the requirements of the specification of the circuit or system being designed to ensure that the design produces the correct outputs.

Exemplary HDL languages are Verilog, VHDL and SystemC. Functional verification is typically done by using software-based simulators and other tools such as testbench generators, static HDL checking tools and formal verification tools. In some situations, special hardware referred to as 'emulators' or 'prototyping systems' are used to speed up the functional verification. Exemplary EDA software products from Synopsys, Inc. of Mountain View, Calif. that can be used at this stage include: VCS, Vera, Designware, Magellan, Formality, ESP and Leda products. Exemplary emulator and prototyping products also available from Synopsys that can be used at this state include: Zebu.RTM. and Protolink.RTM. (RTM="Registered Trademark").

During synthesis and design for test 3054, HDL code is translated to a netlist. This netlist can be optimized for the target technology. Additionally, tests can be designed and implemented to check the finished integrated circuit. Exemplary EDA software products from Synopsys, Inc. of Mountain View, Calif. that can be used at this stage include: Design Compiler, Physical Compiler, Test Compiler, Power Compiler, FPGA Compiler, Tetramax, and Designware products.

During netlist verification 3056, the netlist is checked for compliance with timing constraints and for correspondence with the HDL code. Exemplary EDA software products from Synopsys, Inc. of Mountain View, Calif. that can be used at this stage include: Formality, Primetime, and VCS products.

During design planning 3058, an overall floor plan for the integrated circuit is constructed and analyzed for timing and top-level routing. Exemplary EDA software products from Synopsys, Inc. of Mountain View, Calif. that can be used at this stage include: Astro and IC Compiler products.

During layout implementation 3060, the physical placement (positioning of circuit elements such as transistors or capacitors) and routing (connection of the same by a plurality of conductors) occurs, as can selection of library cells to perform specific logic functions. Exemplary EDA software products from Synopsys, Inc. of Mountain View, Calif. that can be used at this stage include: the Astro and IC Compiler products.

During analysis and extraction 3062, the circuit function is verified at the layout level, which permits refinement of the layout design. Exemplary EDA software products from Synopsys, Inc. of Mountain View, Calif. that can be used at this stage include: Astrorail, Primerail, Primetime, and Star RC/XT products.

During physical verification 3064, the layout design is checked to ensure correctness for manufacturing constraints such as DRC constraints, electrical constraints, lithographic constraints, and circuitry function matching the HDL design specification. Exemplary EDA software products from Synopsys, Inc. of Mountain View, Calif. that can be used at this stage include the Hercules product.

During resolution enhancement 3066, geometric manipulations of the layout are performed to improve manufacturability of the design. Exemplary EDA software products from Synopsys, Inc. of Mountain View, Calif. that can be used at this stage include: *Proteus* products.

During tape-out, data is created to be used (after lithographic enhancements are applied if appropriate) for production of lithography masks. Example EDA software products from Synopsys, Inc., that can be used during tape-out include the IC Compiler and Custom Designer families of products.

During mask-data preparation 3068, the 'tape-out' data is used to produce lithography masks that are used to produce finished integrated circuits. Exemplary EDA software products from Synopsys, Inc. of Mountain View, Calif. that can be used at this stage include the CATS family of products.

For all of the above mentioned integrated circuit design tools, similar tools from other EDA vendors, such as Cadence, Siemens, other corporate entities or various non-commercial tools from universities, or open source repositories, can be used as an alternative.

Embodiments of the present disclosure can be used during one or more of the above-described stages. Specifically, some embodiments of the present disclosure can be used in EDA software 3012.

A storage subsystem is preferably used to store the programs and data structures that provide the functionality of some or all of the EDA tools described herein, and tools applied for development of cells for the library and for physical and logical design using the library. These programs and data structures are generally executed by one or more processors in a manner known to those of ordinary skill in the art.

DETAILED DESCRIPTION—TECHNOLOGY SUPPORT

EMULATION ENVIRONMENT EXPLANATION

Figure 8:
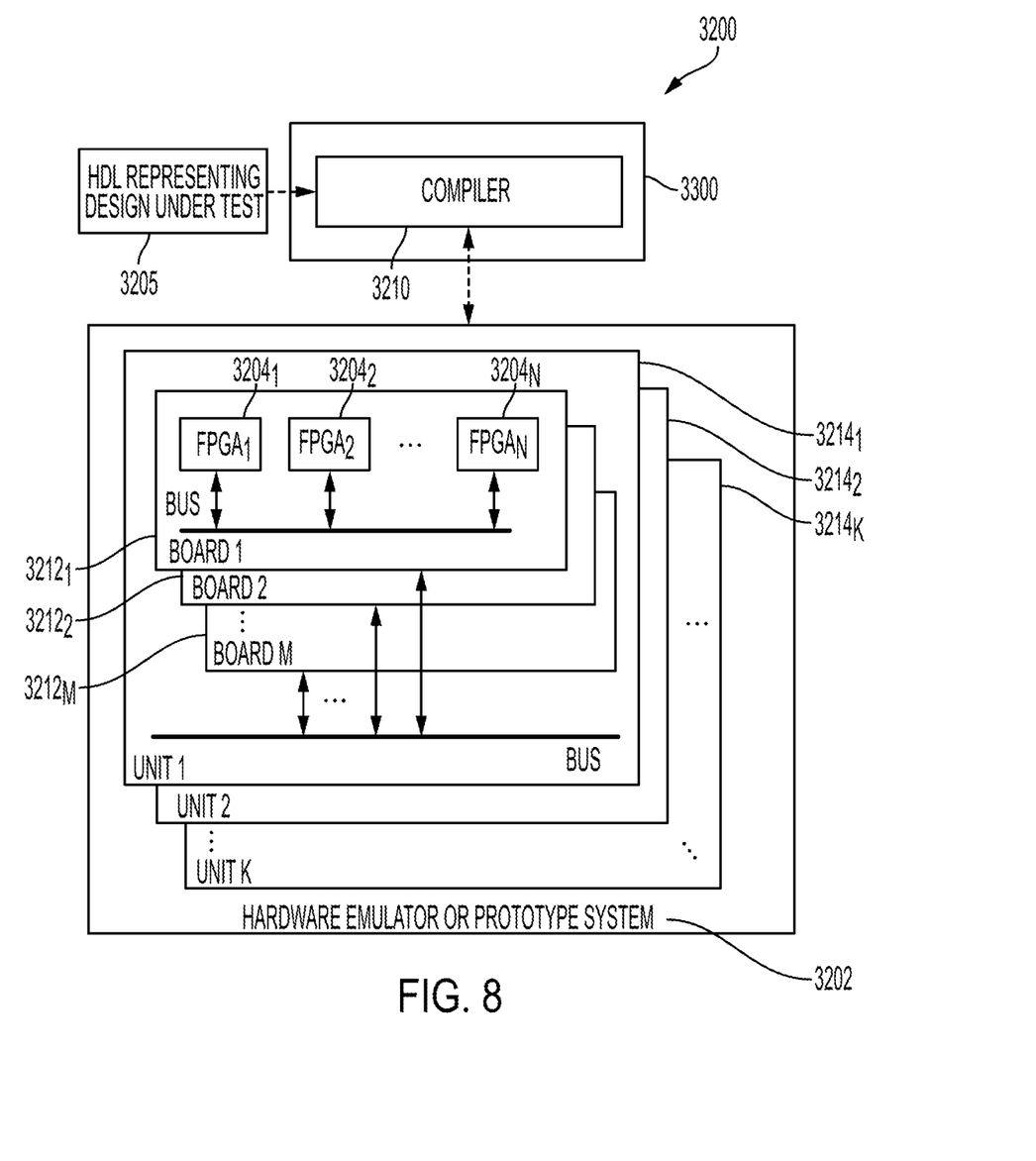
FIG. 8 depicts a block diagram of an emulation system.

An EDA software system, such as element 3012 depicted in FIG. 7, typically includes an emulation system 3054 to verify the functionality of the circuit design. FIG. 8 depicts a typical emulation system which includes a host computer system 3300 (often part of an EDA system) and an emulator system 3202 (typically a set of programmable devices such as Field Programmable Gate Arrays (FPGAs)). The host system generates data and information, typically using a compiler 3210, to configure the emulator to emulate a circuit design. One of more circuit designs to be emulated are referred to as a DUT (Design Under Test). The emulator is a hardware system that emulates a DUT, for example, to use the emulation results for verifying the functionality of the DUT. One example of an emulation system that can be used for the embodiments disclosed herein is the ZeBu Server available from Synopsys, Inc.

The host system 3300 comprises one or more processors. In the embodiment where the host system is comprised of multiple processors, the functions described herein as being performed by the host system may be distributed among the multiple processors.

The host system 3300 typically includes a compiler 3210 that processes code written in a hardware description language that represents a DUT, producing data (typically binary) and information that is used to configure the emulation system 3202 to emulate the DUT. The compiler 3210 may transform, change, reconfigure, add new functions to, and/or control the timing of the DUT.

The host system and emulator exchange data and information using signals carried by an emulation connection. The connection can be one or more electrical cables, for example, cables with pin configurations compatible with the RS232 or USB protocols. The connection can be a wired communication medium or network, such as a local area network, or a wide area network such as the Internet. The connection can be a wireless communication medium or a network with one or more points of access, using a wireless protocol such as Bluetooth.RTM. or IEEE 802.11. The host system and emulator can exchange data and information through a third device, such as a network server.

The emulator includes multiple FPGAs (or other programmable devices), for example, elements $3204_1$ to $304_N$ in FIG. 8. Each FPGA can include one or more FPGA interfaces through which the FPGA is connected to other FPGAs of the emulator (and potentially other emulator hardware components), in order for the FPGAs to exchange signals. An FPGA interface may also be referred to as an input/output pin or an FPGA pad. While some embodiments disclosed herein make use of emulators comprising FPGAs, other embodiments can include other types of logic blocks instead of, or along with, the FPGAs for emulating DUTs, for example, custom FPGAs, specialized ASICs for emulation or prototyping, memories, and input/output devices.

A programmable device may include an array of programmable logic blocks and a hierarchy of reconfigurable interconnects that allow the programmable logic blocks to be connected to each other according to the descriptions in the HDL code. Each of the programmable logic blocks can be configured to perform complex combinational functions, or merely simple logic gates, such as AND, and XOR logic blocks.

In many FPGAs, logic blocks also include memory elements, which may be simple latches, flip-flops or more complex blocks of memory. Depending on the length of the interconnections between different logic blocks, signals may arrive at input terminals of the logic blocks at different times.

Programmable processors $3204_1$-$3204_N$ may be placed into one or more hardware boards $3212_1$ through $3212_M$. Many of such boards may be placed into a hardware unit, e.g. $3214_1$. The boards within a unit may be connected using the backplane of the unit or any other types of connections. In addition, multiple hardware units (e.g., $3214_1$ through $3214_K$) may be connected to each other by cables or any other means to form a multi-unit system. In general, the hardware emulation or prototype system 3202 may be formed using a single board, a single unit with multiple boards, or with multiple units without departing from the teachings of the present disclosure.

For a DUT that is to be emulated, the emulator receives from the host system one or more bit files including a description of the DUT. The bit files further specify partitions of the DUT created by the host system with trace and injection logic, mappings of the partitions to the FPGAs of the emulator, and design constraints. Based on the bit files, the emulator configures the FPGAs to perform the functions of the DUT. With some emulators, one or more FPGAs of an emulator already have the trace and injection logic built into the silicon of the FPGA. For this type of emulator, the FPGAs don't have to be configured by the host system to emulate trace and injection logic.

The host system 3110 receives (e.g., from a user) a description of a DUT that is to be emulated. In one embodiment, the DUT description is in a hardware description language (HDL), such as register transfer language (RTL). In another embodiment, the DUT description is in netlist level files, or a mix of netlist level files and HDL files. If part of the DUT description or the entire DUT description is in a HDL, the host system synthesizes the DUT description to create a gate level netlist based on the DUT description. A host system can use the netlist of the DUT to partition the DUT into multiple partitions, with some of these partitions including trace and injection logic. The trace and injection logic traces interface signals exchanged via the interfaces of an FPGA. Additionally, the trace and injection logic can be used to inject traced interface signals into the logic of the FPGA. The host system maps each partition to an FPGA of the emulator. With some emulators, the trace and injection logic is only included in select partitions for a group of FPGAs. The trace and injection logic can be built into one or more of the FPGAs of an emulator. The host system can synthesize multiplexers to be mapped into the FPGAs. The multiplexers can be used by the trace and injection logic to inject interface signals into the DUT logic.

The host system creates bit files describing each partition of the DUT and the mapping of the partitions to the FPGAs. For partitions in which trace and injection logic was incorporated, the bit files also describe the incorporation of the logic. The bit files may also include place and route information and design constraints. The host system stores the bit files and also stores for components of the DUT information describing which FPGAs are to emulate each component of the DUT (to which FPGAs each component is mapped).

Upon request, the host system transmits the bit files to the emulator. The host system instructs the emulator to emulate the DUT. During emulation of the DUT or at the end of the emulation, the host system receives emulation results from the emulator through the emulation connection. Emulation results are data and information generated by the emulator based on the emulation of the DUT. The emulation results include interface signals (states of interface signals) traced by the trace and injection logic of each FPGA. The host system can stores the emulation results, or transmit them to another processing system.

After emulation of the DUT, a user may request to debug a component of the DUT. If such a request is made the user may provide a time period of the emulation to debug. The host system identifies which FPGAs are configured to emulate the component based on the stored information. The host system retrieves stored interface signals associated with the time period and traced by the trace and injection logic of each identified FPGA. The host system instructs the emulator to re-emulate the identified FPGAs, either one by one, multiple at a time, or altogether. The host system transmits the retrieved interface signals to the emulator in order to re-emulate the component for the time period. The trace and injection logic of each identified FPGA injects its respective interface signals received from the host system into the logic of the DUT mapped to the FPGA. In case of multiple re-emulations of an FPGA, the results may be merged all together to have a full debug view.

The host system receives from the emulator signals traced by logic of the identified FPGAs during the re-emulation of the component. The host system stores the signals received from the emulator. The signals traced during the re-emulation can have a higher sampling rate than during the initial emulation. For example, in the initial run a traced signal may be comprised of a saved hardware state every X milliseconds. However, in the re-emulation the traced signal may be comprised of a saved hardware state every Y milliseconds, where Y is less than X. If the user requests to view a waveform of a signal traced during the re-emulation, the host system can retrieve the stored signal and display a plot of the signal (generates a waveform of the signal). Afterwards the user can, for example, request to re-emulate the same component but for a different time period or to re-emulate another component.

A host system typically comprises at least seven subsystems: a design synthesizer, a mapping module, a run time module, a results module, a debug module, a waveform module, and a storage module. Each of these sub-systems may be embodied as hardware, software, firmware, or a combination thereof. Together these components configure the emulator, and monitor the emulation results.

The design synthesizer converts the HDL of a DUT into gate level logic. For a DUT that is to be emulated, the design synthesizer receives a description of the DUT. If the description of the DUT is fully or partially in HDL (e.g., RTL or other level of abstraction), the design synthesizer 3210 synthesizes the HDL of the DUT to create a gate-level netlist with a description of the DUT in terms of gate level logic.

The mapping module partitions DUTs and maps partitions to emulator FPGAs. The mapping module partitions a DUT at the gate level into a number of partitions using the netlist of the DUT. For each partition, the mapping module retrieves a gate level description of the trace and injection logic and incorporates the logic into the partition. As described above, the trace and injection logic included in a partition is configured to trace signals exchanged via the interfaces of an FPGA to which the partition is mapped (trace interface signals). The trace and injection logic can be incorporated into the DUT prior to the partitioning. For example, the trace and injection logic may be incorporated by the design synthesizer prior to or after the synthesizing the HDL of the DUT. Hence, the trace and injection logic may not match the partitions, it may be a subset, a superset or even different from the partitions.

In addition to including the trace and injection logic, the mapping module may include additional tracing logic in a partition in order to trace the states of certain DUT components that are not traced by the trace and injection logic (to trace signals other than the interface signals traced by the trace and injection logic). The mapping module may include the additional tracing logic in the DUT prior to the partitioning or in partitions after the partitioning. The design synthesizer can include the additional tracing logic in an HDL description of the DUT prior to synthesizing the description.

The mapping module maps each partition of the DUT to an FPGA of the emulator. The mapping module performs the partitioning and mapping using design rules, design constraints (e.g., timing or logic constraints), and information about the emulator. For components of the DUT, the mapping module stores information in the storage module describing which FPGAs are to emulate each component.

Based on the partitioning and the mapping, the mapping module generates one or more bit files that describe the created partitions and the mapping of logic to each FPGA of the emulator. The bit files may include additional information, such as constraints of the DUT, and routing information of connections between FPGAs and connections within each FPGA. The mapping module can generate a bit file for each partition of the DUT, which can be stored in the storage module. Upon request from a user, the mapping module transmits the bit files to the emulator, which the emulator uses to configure the FPGAs to emulate the DUT.

If the emulator includes specialized ASICs that include the trace and injection logic, the mapping module may generate a specific configuration allowing to connect them to the DUT or just save the information of what traced/injected signal is and where the information is stored on the specialized ASIC.

The run time module controls emulations performed on the emulator. The run time module may cause the emulator to start or stop executing an emulation. Additionally, the run time module may provide input signals/data to the emulator. The input signals may be provided directly to the emulator through the connection or indirectly through other input signal devices. For example, the host system with the run time module may control an input signal device to provide the input signals to the emulator. The input signal device may be, for example, a test board (directly or through cables), signal generator, another emulator, or another host system.

The results module processes emulation results generated by the emulator. During emulation and/or after completing the emulation, the results module receives emulation results from the emulator generated during the emulation. The emulation results include signals traced during the emulation. Specifically, the emulation results include interface signals traced by the trace and injection logic emulated by each FPGA. The emulation results may also include signals traced by additional logic included in the DUT. Each traced signal can span multiple cycles of the emulation. A traced signal is comprised of multiple hardware states and each hardware state is associated with a time of the emulation. The results module stores the traced signals received in the storage module. For each stored signal, the results module can store information indicating which FPGA generated the traced signal.

The debug module allows users to debug DUT components. After the emulator has emulated a DUT and the results module has received the interface signals traced by the trace and injection logic during the emulation, a user may request to debug a component of the DUT by re-emulating the component for a specific time period. In a request to debug a component, the user identifies the component and indicates a time period of the emulation to debug. The user's request can also include a sampling rate that indicates how often hardware states should be saved by logic that traces signals.

The debug module identifies the one or more FPGAs of the emulator that are configured to emulate the component based on the information stored by the mapping module in the storage module. For each identified FPGA, the debug module retrieves, from the storage module, interface signals traced by the trace and injection logic of the FPGA during the time period indicated by the user (i.e., retrieve hardware states traced by the trace and injection logic that are associated with the time period).

The debug module transmits the retrieved interface signals to the emulator. The debug module instructs the debug module to run the identified FPGAs and for the trace and injection logic of each identified FPGA to inject its respective traced signals into logic of the FPGA in order to re-emulate the component for the requested time period. The debug module can also transmit the sampling rate provided by the user to the emulator so that the tracing logic traces hardware states at the proper intervals.

To debug the component, the emulator only has to run the FPGAs to which the component has been mapped. Additionally, the re-emulation of the component does not have to start from the beginning, but can start at any point desired by the user.

For an identified FPGA, the debug module can transmit instructions to the emulator to load multiple emulator FPGAs with the same configuration of the identified FPGA. The debug module additionally instructs the emulator to run the multiple FPGAs in parallel. Each FPGA from the multiple FPGAs is run with a different time window of the interface signals in order to generate a larger time window in a shorter amount of time. For example, for the identified FPGA to run a certain amount of cycles it may take an hour. However, if multiple FPGAs are loaded with the configuration of the identified FPGA and each of the FPGAs runs a subset of the cycles, it may only take a few minutes for the FPGAs to collectively run all of the cycles.

A user may identify a hierarchy or a list of DUT signals to re-emulate. To enable this, the debug module determines the FPGA needed to emulate the hierarchy or list of signals, retrieves the necessary interface signals and transmits the retrieved interface signals to the emulator for re-emulation. Hence, a user can identify any element (e.g., component or signal) of the DUT to debug/re-emulate.

The waveform module generates waveforms based on traced signals. If a user requests to view a waveform of a signal traced during an emulation run, the host system retrieves the signal from the storage module. The waveform module displays a plot of the signal to the user. For one or more signals, when the signals are received from the emulator, the waveform module can automatically generate the plots of the signals.

DETAILED DESCRIPTION—SEMANTIC SUPPORT

The signifier 'commercial solution' signifies, solely for the following paragraph, an engineering domain-specific (and thus non-preemptive—see Bilski) electronic structure, process for specified machines, manufacturable circuit (and their Church-Turing equivalents) or composition of matter that is useful in commerce to solve a problem of technology, that is, a use in commerce of an application of science or use in commerce of technology.

The signifier 'abstract' (when used in a patent claim for any embodiments disclosed herein for a new commercial solution that is a scientific application of one or more laws of nature {see Benson}, and that solves a problem of technology {see Diehr} used in commerce—or improves upon an existing commercial solution {see Diehr})—is precisely defined by the inventor(s) {see MPEP 2111.01} as follows:

a) a new commercial solution is 'abstract' if it is not novel (e.g., it is so well known in equal prior art {see Alice} and/or the use of equivalent prior art solutions is long prevalent {see Bilski} in science, engineering or commerce), and thus unpatentable under 35 U.S.C. 102, for example, because it is "difficult to understand" {see Merriam-Webster definition for 'abstract'} how the commercial solution differs from equivalent prior art solutions; or b) a new commercial solution is 'abstract' if it is obvious, that is, if the existing prior art includes at least one analogous prior art solution {see KSR}, or the existing prior art includes at least two prior art items that can be combined {see Alice} by a person having ordinary skill in the art {a "PHOSITA", see MPEP 2141-2144} to be equivalent to the new commercial solution, and is thus unpatentable under 35 U.S.C. 103, for example, because it is "difficult to understand" how the new commercial solution differs from a PHOSITA-combination/-application of the existing prior art; or c) a new commercial solution is 'abstract' if it is not disclosed with an enabling description either because there is insufficient guidance in the enabling description, or because only a generic implementation is described {see Mayo} with unspecified elements, parameters or functionality, so that a PHOSITA is unable to instantiate a useful embodiment of the new commercial solution, without, for example, requiring special programming {see Katz} or circuit design to be performed by the PHOSITA), and is thus unpatentable under 35 U.S.C. 112, for example, because it is "difficult to understand" how to use in commerce any embodiment of the new commercial solution.

DETAILED DESCRIPTION—CONCLUSION

The foregoing Detailed Description signifies in isolation the individual features, structures, functions, or characteristics described herein and any combination of two or more such features, structures, functions or characteristics, to the extent that such features, structures, functions or characteristics or combinations thereof are based on the present specification as a whole in light of the knowledge of a person skilled in the art, irrespective of whether such features, structures, functions or characteristics, or combinations thereof solve any problems disclosed herein, and without limitation to the scope of the claims. When an embodiment of a claimed invention comprises a particular feature, structure, function or characteristic, it is within the knowledge of a person skilled in the art to use such feature, structure, function, or characteristic in connection with other embodiments whether or not explicitly described, for example, as a substitute for another feature, structure, function or characteristic.

In view of the foregoing Detailed Description it will be evident to a person skilled in the art that many variations may be made within the scope of innovations, embodiments and/or examples, such as function and arrangement of elements, described herein without departing from the principles described herein. One or more elements of an embodiment may be substituted for one or more elements in another embodiment, as will be apparent to those skilled in the art. The embodiments described herein are chosen to signify the principles of the invention and its useful application, thereby enabling others skilled in the art to understand how various embodiments and variations are suited to the particular uses signified.

The foregoing Detailed Description of innovations, embodiments, and/or examples of the claimed inventions has been provided for the purposes of illustration and description. It is not intended to be exhaustive nor to limit the claimed inventions to the precise forms described but is to be accorded the widest scope consistent with the principles and features disclosed herein. Obviously, many variations will be recognized by a person skilled in this art. Without limitation, any and all equivalents described, signified or incorporated by reference in this patent application are specifically incorporated by reference into the description herein of the innovations, embodiments and/or examples. In addition, any and all variations described, signified or incorporated by reference herein with respect to any one embodiment are also to be considered taught with respect to all other embodiments. Any such variations include both currently known variations as well as future variations, for example any element used herein includes a future equivalent element that provides the same function, regardless of the structure of the future equivalent.

It is intended that the scope of the claimed inventions be defined and judged by the following claims and equivalents. The following claims are hereby incorporated into the Detailed Description, with each claim standing on its own as a separate embodiment. Disclosed embodiments can be described with more features than are expressly recited in the claims.

What is claimed is:

1. A method of estimating a toggle count of a circuit, the method comprising:
    simulating the circuit to generate training data and an associated training toggle count of internal nodes of the circuit in response to a test bench;
    training a neural network system to generate an estimate of the training toggle count in accordance with the training data and the associated training toggle count;
    simulating the circuit to generate simulation data in response to a first set of input values applied to the circuit; and
    invoking the trained neural network system to estimate a number of toggles of the internal nodes of the circuit from the simulation data.

2. The method of claim 1 wherein the training data comprises values of input signals applied to the circuit and values of registers disposed in the circuit for a plurality of time stamps.

3. The method of claim 2 wherein said neural network system comprises at least three layers.

4. The method of claim 3 wherein a first layer of the neural network system comprises first and second neural networks, wherein the first neural network is configured to receive input signals and register values associated with a timestamp immediately preceding a current timestamp, and wherein the second neural network is configured to receive input signals and register values associated with the current timestamp, wherein said first and second neural networks of the first layer have a same number of input/output nodes and a same weight between their corresponding nodes.

5. The method of claim 4 wherein a second layer of the neural network system is configured to determine a pairwise distance between corresponding output nodes of the first and second neural networks of the first layer and to supply an output value in response.

6. The method of claim 5 wherein a third layer of the neural network system is configured to normalize the output value of the second layer of the neural network system.

7. A system comprising:
    a memory; and
    a processor, operatively coupled with the memory, to:
    implement first and second neural networks;
    receive, at the first neural network, input signals and register values associated with a simulation timestamp immediately preceding a current timestamp cycle of a circuit design; and
    receive, at the second neural network, input signals and register values associated with the current simulation timestamp of circuit design, wherein said first and second neural networks are part of a first layer of a neural network system and have a same number of input/output nodes and a same weight between their corresponding nodes.

8. The system of claim 7 further comprising a second layer configured to determine a pairwise distance between corresponding output nodes of the first and second neural networks of the first layer and supply an output value in response.

9. The system of claim 8 further comprising a third layer configured to normalize the output value of the second layer representative of a number of toggles of the simulation.

10. A non-transitory computer readable medium comprising stored instructions, which when executed by a processor, cause the processor to:
implement first and second neural networks;
receive, at the first neural network, input signals and register values associated with a simulation timestamp immediately preceding a current timestamp cycle of a circuit design;
receive, at the second neural network, input signals and register values associated with the current simulation timestamp of circuit design, wherein said first and second neural networks are part of a first layer of a system and have a same number of input/output nodes and a same weight between their corresponding nodes.

11. The non-transitory computer readable medium of claim 10 wherein the instructions further cause the processor to implement a second layer configured to determine a pairwise distance between corresponding output nodes of the first and second neural networks of the first layer and supply an output value in response.

12. The non-transitory computer readable medium of claim 11 wherein the instructions further cause the processor to implement a third layer configured to normalize the output value of the second layer representative of a number of toggles of the simulation.

* * * * *